3,589,898
LITHO PLATE

Douglas James Fry and Brian Ronald David Whitear, Ilford, Essex, England, assignors to Polychrome Corporation, Yonkers, N.Y.

No Drawing. Filed Oct. 8, 1968, Ser. No. 765,960
Int. Cl. G03f 7/08
U.S. Cl. 96—33 4 Claims

ABSTRACT OF THE DISCLOSURE

This application describes a positive working presensitised lithographic plate which comprises a support base having thereon a light-sensitive coating which comprises an O-naphthoquinone 1,2 diazide or an O-benzoquinone 1,2 diazide and dispersed throughout the coating a photochromic compound which on exposure to strong light changes to a colour the absorption of which is above 500 nm.

This invention relates to positive-working presensitised lithographic plates.

Printing operatives who use positive-working presensitised lithographic plates like to inspect the printing image after the plate has been exposed and before it has been developed to enable them to give a further exposure if necessary or effect other corrections. It is the object of the present invention to provide a positive-working presensitised lithographic plate on which the image is clearly differentiated from the background after exposure.

Therefore according to the present invention there is provided a positive-working presensitised lithographic plate which comprises a support base having thereon a light-sensitive coating which comprises an O-naphthoquinone 1,2-diazide or an O-benzoquinone 1,2-diazide and dispersed throughout the coating a photochromic compound which on exposure to strong light changes to a colour the absorption of which is above 500 nm.

The preferred photochromic compound is 3-pyridylsydnone (1). This compound on exposure to light changes from colourless to a deep blue. Another useful compound is 2,2′,4′-nitro benzyl pyridine (2).

As O-naphthoquinone or O-benzoquinone diazide coatings are a yellow colour a good image differentiation is obtained after exposure the background being bluish in colour and the image areas being yellow.

The light sensitive coating may contain resins, plasticisers and other additives normally added to such light-sensitive coating.

A particularly useful light-sensitive coating which comprises an O-naphthoquinone diazide and an alnoval resin is described in British Pat. 711,626. Other O-naphthoquinone and benzoquinone diazides are described in British Pats. 699,412; 706,028 and 729,746.

The support for the light-sensitive coating may be a metal plate such as anodised aluminum, treaded or laminated paper or a plastics material film.

The following examples will serve to illustrate the invention.

EXMPLE 1

A condensation product of naphthoquinone 1,2-diazide, 5-sulphonyl chloride and a phenol-formaldehyde resin (Alnovol 429) was prepared as described in British Pat. 711,625. The condensation product was dissolved in 2-methoxyethanol as a 5% solution and 1% by weight of 2,2′,4′-dinitrobenzyl pyridine was dissolved in this solution. The solution was then coated on to an aluminium plate having an anodised surface and then dried. After drying the coating was allowed to stand for 2 hours to enable the dinitrobenzyl pyridine to form micro crystals.

The light-sensitive plate thus produced was imagewise exposed to an original using ultra-violet light. Immediately after exposure the yellow image was visually distinct from the blue light-exposed background. The image was then developed by wiping over the plate an aqueous alkaline butter solution, e.g. trisodium phosphate until the blue background areas had been removed. The image was then inked-up and used normally on an offset printing machine. The presence of the photochromic compound in the non-image areas did not affect the development of the plate and the presence of the unexposed photochromic compound in the image areas did not affect oleophilic properties of the unexposed image areas.

EXAMPLE 2

This example is essentially the same as Example 1 except the 1% by weight of 2,2′,4′-dinitrobenzyl pyridine was replaced by 1% by weight of 3-pyridiyl sydnone. The sensitised lithographic plate was exposed in the same way and with exactly the same results.

We claim as our invention:

1. A positive working presensitised lithographic plate which comprises a support base having thereon a light-sensitive coating which comprises an O-naphthoquinone 1,2 diazide or an O-benzoquinone 1,2 diazide and dispersed throughout the coating a photochromic compound which on exposure to strong light changes to a colour the absorption of which is above 500 nm., said compound being present in an amount sufficient to differentiate an image from its background after exposure of the plate but before development.

2. A lithographic plate according to claim 1 wherein the photochromic compound is 3-pyridyl-sydnone.

3. A lithographic plate according to claim 1 wherein the photochromic compound is 2,2′,4′-di-nitrobenzyl pyridine.

4. A lithographic plate according to claim 1 wherein the coating comprises O-naphthoquinone 1,2 diazide and a phenol formaldehyde resin with a photochromic compound dispersed therein, said compound being either 3-pyridyl-sydnone or 2,2′,4′-di-nitrobenzyl pyridine.

References Cited

UNITED STATES PATENTS

| | | | |
|---|---|---|---|
| 2,767,092 | 10/1956 | Schmidt | 96—91 |
| 3,050,389 | 8/1962 | Süs | 96—33 |
| 3,126,281 | 3/1964 | Süs et al. | 96—91 |
| 3,188,210 | 6/1965 | Fritz et al. | 96—33 |
| 3,194,963 | 7/1965 | McKee | 96—91X |
| 3,278,449 | 10/1966 | Hardwick et al. | 96—91X |

FOREIGN PATENTS

| | | | |
|---|---|---|---|
| 729,746 | 5/1955 | Great Britain | 96—33 |

(Other references on following page)

OTHER REFERENCES

Ficalbi 10501(b), vol. 60, Chem Abstracts.
Wettermark et al. 12553(b), vol. 63, Chem Abstracts.
Sousa et al. 513(h), vol. 62, Chem Abstracts.
Hiroaka 161(f) vol. 62, Chem Abstracts.
Journal of the Chemical Society, 1952, p. 587.
Journal of the American Chemical Society, vol. 77, pp. 6604–6607.
Metz et al., J. Phys Chem, vol. 66, pp. 2446–9 (1962) "... Sydnones."

Mill et al., J. Chem Phys, vol. 35, pp. 1139–40 (1961) "... Sydnones."

WILLIAM D. MARTIN, Primary Examiner
M. R. P. PERRONE, Jr., Assistant Examiner

U.S. Cl. X.R.

96—75, 89, 91D

PO-1050
(5/69)

UNITED STATES PATENT OFFICE
CERTIFICATE OF CORRECTION

Patent No. 3,589,898 Dated June 29, 1971

Inventor(s) Douglas James Fry and Brian Ronald David Whitear

It is certified that error appears in the above-identified patent and that said Letters Patent are hereby corrected as shown below:

Claims priority, British Application No. 47688/67, filed October 19, 1967

Column 2, line 26, "pyridiyl" should read --pyridyl--

Signed and sealed this 8th day of February 1972.

(SEAL)
Attest:

EDWARD M.FLETCHER,JR.
Attesting Officer

ROBERT GOTTSCHALK
Commissioner of Patents